(12) United States Patent
Huang et al.

(10) Patent No.: US 12,400,931 B2
(45) Date of Patent: Aug. 26, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yu-Lung Huang, Taichung (TW); Chih-Ming Huang, Taichung (TW); Kuo-Hua Yu, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 575 days.

(21) Appl. No.: 17/850,527

(22) Filed: Jun. 27, 2022

(65) Prior Publication Data

US 2023/0014476 A1 Jan. 19, 2023

(30) Foreign Application Priority Data

Jul. 14, 2021 (TW) .................................. 110125881

(51) Int. Cl.
*H01L 23/42* (2006.01)
*H01L 21/54* (2006.01)
*H01L 21/56* (2006.01)
*H01L 23/40* (2006.01)

(52) U.S. Cl.
CPC ............. *H01L 23/42* (2013.01); *H01L 21/54* (2013.01); *H01L 21/56* (2013.01); *H01L 23/4093* (2013.01)

(58) Field of Classification Search
CPC ... H01L 21/54; H01L 23/42; H01L 23/49568; H01L 23/4334
See application file for complete search history.

(56) References Cited

U.S. PATENT DOCUMENTS

| 2004/0174682 A1* | 9/2004 | Lin | .......................... H01L 23/36 |
| | | | 361/708 |
| 2004/0178494 A1* | 9/2004 | Lin | ..................... H01L 23/3675 |
| | | | 257/710 |
| 2018/0134546 A1* | 5/2018 | Oh | .......................... H01L 23/315 |
| 2021/0391235 A1* | 12/2021 | Qu | .......................... H01L 23/373 |

* cited by examiner

*Primary Examiner* — Joshua Benitez Rosario
*Assistant Examiner* — Jacob T Nelson
(74) *Attorney, Agent, or Firm* — Dority & Manning, PA (57) ABSTRACT

An electronic package, in which a heat dissipation structure is disposed on a carrier structure to form a packaging space for electronic components to be accommodated in the packaging space, and the electronic components are completely encapsulated by a heat dissipation material to prevent the electronic components exposing from the heat dissipation material so as to improve the heat dissipation effect.

20 Claims, 14 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package with a heat dissipation structure and a manufacturing method thereof.

2. Description of Related Art

With the improvements of requirements in functions and process speed for electronic products, a semiconductor chip as a core component of the electronic product requires electronic components and electronic circuits with higher density, so a greater amount of heat will be generated from the semiconductor chip during its operation. Besides, since the conventional packaging colloid for encapsulating the semiconductor chip is a poor heat transfer material (i.e., the efficiency of the heat dissipation is poor) with thermal conductivity of only 0.8 Watt/meter-Kelvin ($W \cdot m^{-1} \cdot k^{-1}$), damages of the semiconductor chips and product reliability problems will be occurred if the heat generated from the semiconductor chips cannot be dissipated effectively.

Therefore, in order to rapidly dissipate the heat to the outside, a heat sink (heat spreader) is usually disposed in the semiconductor packages, the heat sink is bonded onto the backside of the semiconductor chip by a heat dissipation colloid, such as a thermal interface material (TIM), so as to dissipate the heat generated from the semiconductor chip by the heat dissipation colloid and the heat sink; in addition, the top of the heat sink is usually exposed from the packaging colloid or directly exposed to the atmosphere to obtain a better heat dissipation effect.

Figure 1:
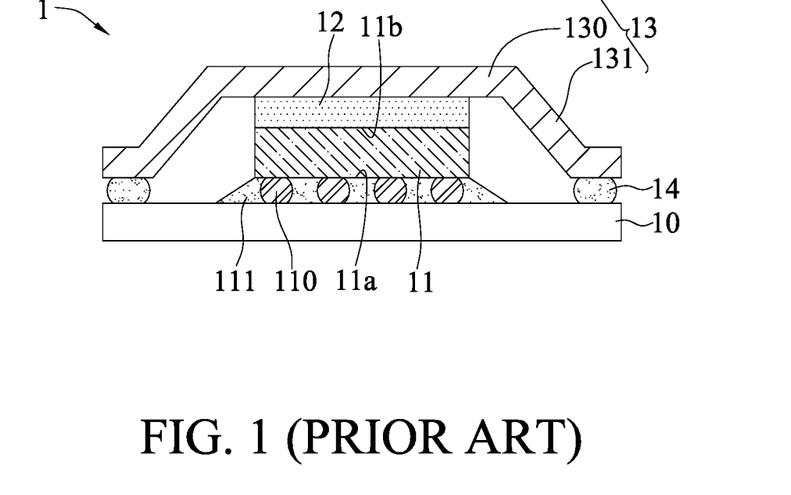
FIG. 1 is a schematic cross-sectional view of a conventional semiconductor package.

As shown in FIG. 1, in a conventional semiconductor package 1, a semiconductor chip 11 is firstly disposed on a packaging substrate 10 with its active surface 11a by flip-chip bonding (i.e., through conductive bumps 110 and an underfill 111), and then a heat dissipation member 13 is bonded onto the inactive surface 11b of the semiconductor chip 11 with its top sheet 130 by a TIM layer 12, and supporting legs 131 of the heat dissipation member 13 are disposed on the packaging substrate 10 via an adhesive layer 14.

During the operation, the heat generated from the semiconductor chip 11 is transferred to the top sheet 130 of the heat dissipation member 13 by the inactive surface 11b and the TIM layer 12 so as to be dissipated to outside of the semiconductor package 1.

However, in the conventional semiconductor package 1, the TIM layer 12 is only laid on the inactive surface 11b of the semiconductor chip 11, such that the heat dissipation effect is poor.

Therefore, how to overcome the aforementioned drawbacks of the prior art has become an urgent issue to be solved at present.

SUMMARY

In view of the aforementioned shortcomings of the prior art, the present disclosure provides an electronic package, which comprises: a carrier structure; an electronic component disposed on the carrier structure; a heat dissipation structure including a heat dissipation body covering the electronic component and supporting legs vertically disposed on the heat dissipation body, wherein the heat dissipation structure is bonded onto the carrier structure via the supporting legs, such that a packaging space is formed between the heat dissipation body and the carrier structure, and the electronic component is disposed in the packaging space; and a heat dissipation material disposed in the packaging space and completely encapsulating the electronic component, wherein the electronic component is free from being exposed from the heat dissipation material.

The present disclosure further provides a manufacturing method for an electronic package, which comprises: providing a heat dissipation structure and a carrier structure with an electronic component, wherein the heat dissipation structure includes a heat dissipation body covering the electronic component and supporting legs vertically disposed on the heat dissipation body; bonding the supporting legs to the carrier structure to form a packaging space between the heat dissipation body and the carrier structure, wherein the electronic component is located in the packaging space; and disposing a heat dissipation material in the packaging space to completely encapsulate the electronic component, wherein the electronic component is free from being exposed from the heat dissipation material.

In the aforementioned electronic package and manufacturing method thereof, the electronic component is in a form of laid package.

In the aforementioned electronic package and manufacturing method thereof, the electronic component is in a form of upright package.

In the aforementioned electronic package and manufacturing method thereof, the supporting legs are fixed on the carrier structure via a bonding material. For instance, the supporting legs are formed with accommodation ports for filling the bonding material.

In the aforementioned electronic package and manufacturing method thereof, the supporting legs and the carrier structure are spaced apart to form accommodation spaces. For instance, the accommodation spaces are accommodated with passive components.

In the aforementioned electronic package and manufacturing method thereof, the packaging space is free from being filled up with the heat dissipation material, and remaining spaces of the packaging space are used as target spaces.

In the aforementioned electronic package and manufacturing method thereof, the heat dissipation structure is formed with a first port and a second port that are communicating the packaging space, and the first port and the second port are located at different locations, wherein the heat dissipation material is filled into the packaging space via the first port, and the second port is used to exhaust air. For instance, the present disclosure further comprises covering the first port and the second port respectively via a plurality of plugs after the heat dissipation material completely encapsulating the electronic component.

In the aforementioned electronic package and manufacturing method thereof, the supporting legs cover side surfaces of the carrier structure.

In the aforementioned electronic package and manufacturing method thereof, the present disclosure further comprises clamping the supporting legs and the carrier structure via clamps.

As can be understood from the above, in the electronic package and manufacturing method thereof of the present disclosure, the electronic component is not exposed from the heat dissipation material since the electronic component is completely encapsulated by the heat dissipation material. Thus, compared with the prior art, the present disclosure is capable of substantially improving the heat dissipation effect.

BRIEF DESCRIPTION OF THE DRAWINGS

FIG. 2A-1 is a schematic cross-sectional view of an electronic package according to a first embodiment of the present disclosure.

FIG. 2A-2 and FIG. 2A-3 are schematic partial cross-sectional views of different aspects of FIG. 2A-1.

FIG. 5A-1 is a schematic top view of an electronic package according to a third embodiment of the present disclosure.

FIG. 5A-2 is a schematic top view of another aspect of FIG. 5A-1.

FIG. 5F-1 is a schematic cross-sectional view of another aspect of FIG. 5B.

FIG. 5F-2 is a schematic cross-sectional view of another aspect of FIG. 5F-1.

DETAILED DESCRIPTION

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure. Meanwhile, terms such as "above," "first," "second," "a," "an," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figure 2A:
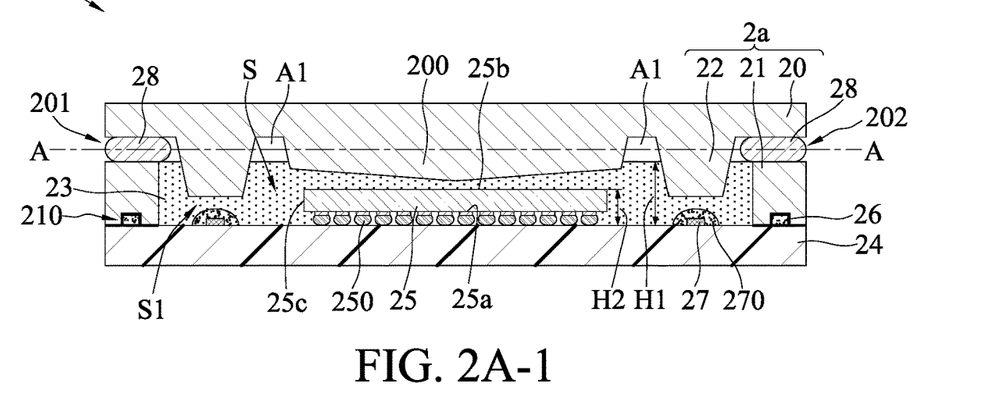

FIG. 2A-1 is a schematic cross-sectional view of an electronic package 2 according to a first embodiment of the present disclosure.

As shown in FIG. 2A-1, the electronic package 2 comprises: a carrier structure 24, at least one electronic component 25 disposed on the carrier structure 24, a heat dissipation structure 2a disposed on the carrier structure 24 to cover the electronic component 25, and a heat dissipation material 23 for encapsulating the electronic component 25, wherein the heat dissipation structure 2a comprises a sheet-shaped heat dissipation body 20 and a plurality of first supporting legs 21 and a plurality of second supporting legs 22 vertically disposed on the heat dissipation body 20.

A protruding heat dissipation block 200 is integrally formed with and on a partial surface of the heat dissipation body 20.

In an embodiment, the heat dissipation block 200 is in a shape of a cone or a hill, and a top end of the heat dissipation block 200 is closest to the electronic component 25.

Figure 2A:
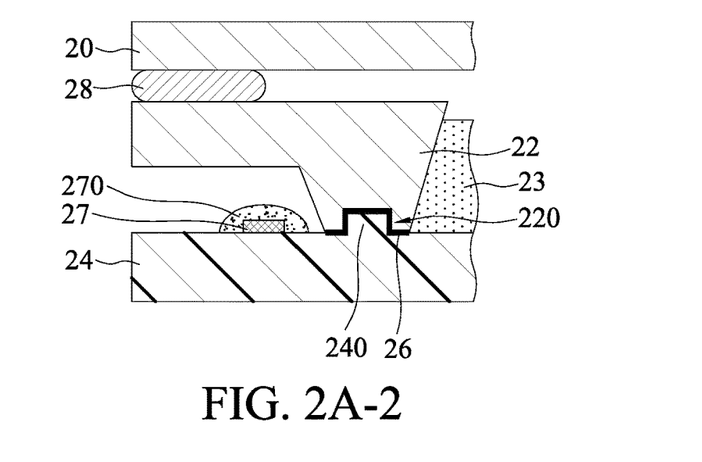
Figure 2A:
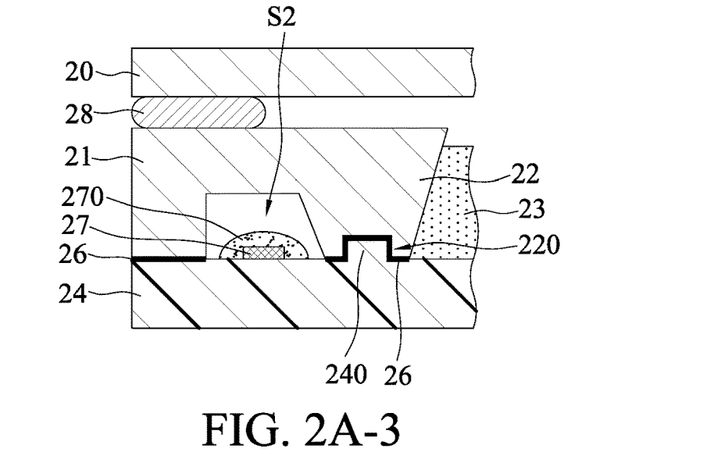
Figure 2B:
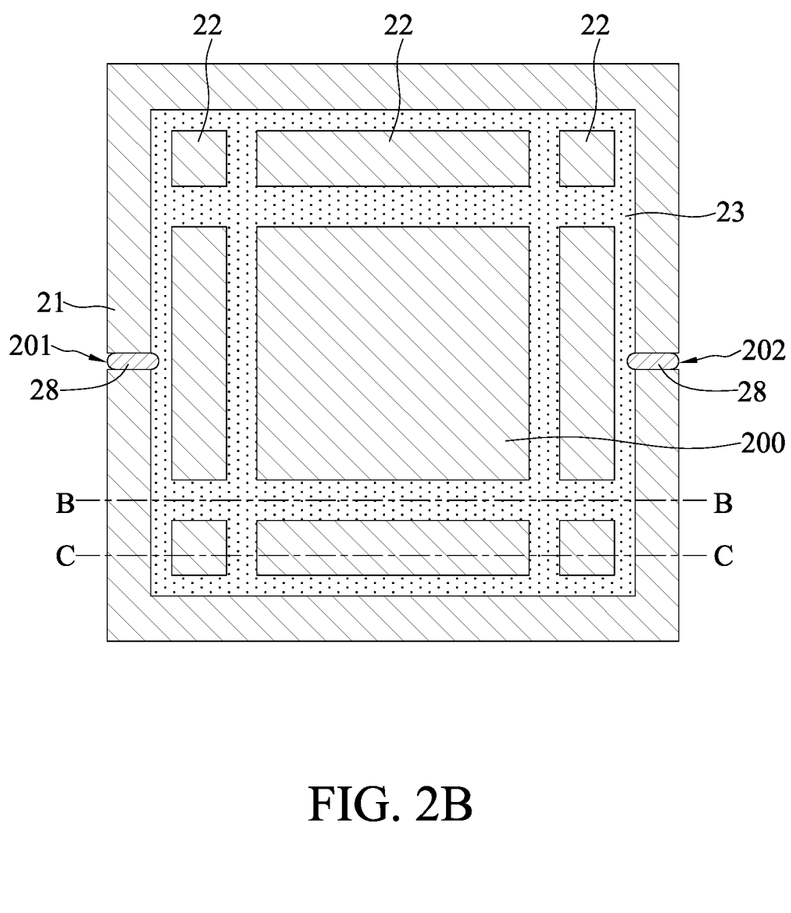
FIG. 2B is a schematic top view along a cross section A-A of FIG. 2A-1.

The first supporting leg 21 is used as a wall-shaped outer leg, as shown in FIG. 2B, the first supporting leg 21 is vertically disposed on the carrier structure 24 by a bonding material 26 such as a glue material.

In an embodiment, the first supporting leg 21 can be formed with at least one accommodation port 210 that can be filled with a colloid (such as the bonding material 26) in accordance to requirements.

The second supporting leg 22 is used as a column-shaped or wall-shaped inner leg, as shown in FIG. 2B, the second supporting leg 22 and the carrier structure 24 are spaced apart to form an accommodation space S1 for accommodating at least one passive component 27 (such as a resistor, a capacitor, and an inductor) on the carrier structure 24, wherein the passive component 27 is electrically connected to circuit layers of the carrier structure 24 and is encapsulated by an insulating material 270.

In another embodiment, as shown in FIG. 2A-2, the second supporting leg 22 can be formed with at least one accommodation port 220 that can be coated with a colloid (such as the bonding material 26) to engage with a protruding portion 240 of the carrier structure 24 according to requirements, thereby neglecting the configuration of the first supporting leg 21, wherein the passive component 27 can be disposed on the carrier structure 24 at the periphery of the second supporting leg 22. Alternatively, as shown in FIG. 2A-3, the first supporting leg 21 and the second supporting leg 22 are both vertically disposed on the carrier structure 24 to form another accommodation space S2 between the first supporting leg 21 and the second supporting leg 22 for disposing at least one passive component 27 in the accommodation space S2 on the carrier structure 24, wherein the passive component 27 is electrically connected to circuit layers of the carrier structure 24.

As a result, the heat dissipation body 20 is disposed on the carrier structure 24 by the first supporting leg 21 and/or the second supporting leg 22, so that a packaging space S (which may include the accommodation spaces S1, S2 in accordance to requirements) is formed between the heat dissipation body 20 and the carrier structure 24 for accommodating the electronic component 25 (and the passive component 27) in the packaging space S (and the accommodation spaces S1, S2).

The heat dissipation material 23 is formed in the packaging space S to encapsulate the electronic component 25, and the packaging space S is not filled up with the heat dissipation material 23, so that the remaining spaces of the packaging space S are used as target spaces A1, as shown in FIG. 2A-1, the target spaces A1 are formed between the heat dissipation material 23 and the heat dissipation body 20.

In an embodiment, the heat dissipation material 23 has a high thermal conductivity, about 30-80 Watt/m-Kelvin ($Wm^{-1}K^{-1}$). For example, when an underfill (not shown) is formed between an active surface 25a of the electronic component 25 and the carrier structure 24 to insulate conductive bumps 250 from the outside, then the heat dissipation material 23 is solid indium, liquid metal or any other metal-containing material that is fluid at room temperature/high temperature to be used as a thermal interface material (TIM), such as a low-temperature melting thermally conductive material. If there is no underfill (not shown) between the active surface 25a of the electronic component 25 and the carrier structure 24, then liquid oil or other liquids without metal material can be used as a heat dissipation material.

Moreover, during the manufacturing process, the heat dissipation material 23 is formed by a filling method. For example, a first port 201 and a second port 202 are formed between the heat dissipation body 20 and the first supporting leg 21 (or the second supporting leg 22 shown in FIG. 2A-2) at different locations, as shown in FIG. 2A-1, the first port 201 and the second port 202 communicate the packaging space S, so that after the heat dissipation structure 2a is fixed on the carrier structure 24, the heat dissipation material 23 is injected into the packaging space S via the first port 201 acting as a filling port, such that the heat dissipation material 23 completely encapsulates the electronic component 25, and after filling with the heat dissipation material 23, the first port 201 is covered by a plug 28, as shown in FIG. 2A-1 and FIG. 2B. It should be understood that the second port 202 is used as an exhausting port to facilitate the flow of the heat dissipation material 23 to discharge a large amount of air out of the packaging space S, and after filling with the heat dissipation material 23, the second port 202 is covered by the plug 28, as shown in FIG. 2A-1 and FIG. 2B, so that a portion of the air remains in the target space A1.

The carrier structure 24 is a rectangular body, such as a packaging substrate with a core layer and a circuit structure, a packaging substrate with a coreless circuit structure, through silicon interposer (TSI) with a conductive through-silicon via (TSV) or other plate types, the carrier structure 24 comprises at least one insulating layer and at least one circuit layer bonded with the insulating layer, such as at least one fan-out type redistribution layer (RDL). It can be understood that the carrier structure 24 can also be other plates for carrying chips, such as lead frames, wafers, or other plate bodies with metal routings, etc., which are not limited to the above.

In an embodiment, the carrier structure 24 is placed on a process machine, such that the first port 201 and the second port 202 of the heat dissipation structure 2a face the left and right directions.

The electronic component 25 is an active component, a passive component, a chip module, or a combination thereof, wherein the active component is for example a semiconductor chip, and the passive component is for example a resistor, a capacitor, and an inductor.

In an embodiment, the electronic component 25 is in a form of laid package semiconductor chip, which has an active surface 25a (or bottom surface) and an inactive surface 25b (or top surface) opposing to the active surface 25a, such that the active surface 25a is disposed on the circuit layers of the carrier structure 24 in a flip-chip manner via a plurality of conductive bumps 250 such as solder materials, metal pillars, or others, and the electronic component 25 is electrically connected to the circuit layers, and the heat dissipation material 23 or underfill (not shown) encapsulates each of the conductive bumps 250; alternatively, the electronic component 25 can be electrically connected to the circuit layers of the carrier structure 24 via a plurality of bonding wires (not shown) in a wire-bonding manner; or the electronic component 25 can directly contact the circuit layers of the carrier structure 24. It should be understood that there are various means for the electronic component 25 to be electrically connected to the carrier structure 24, and the required types and quantities of the electronic components can be disposed on the carrier structure 24 and not limited to the above.

Figure 2C:
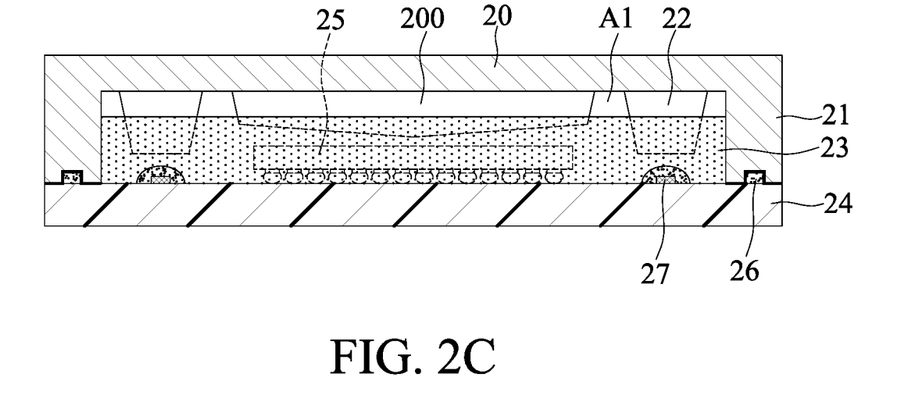
FIG. 2C is a schematic cross-sectional view along a cross-section line B-B of FIG. 2B.
Figure 2D:
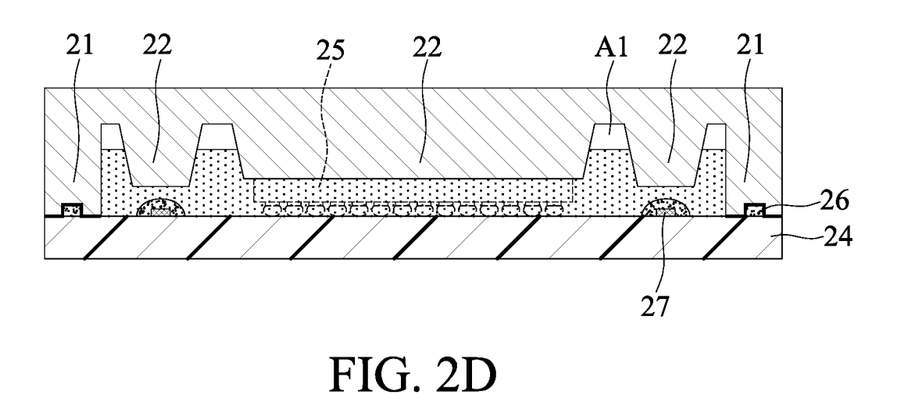
FIG. 2D is a schematic cross-sectional view along a cross-section line C-C of FIG. 2B.

Hence, in the electronic package 2 of the present disclosure, the surface height H1 (i.e., the liquid height position) of the heat dissipation material 23 relative to the carrier structure 24 is higher than the surface height H2 (i.e., the height position of the inactive surface 25b) of the electronic component 25 relative to the carrier structure 24, such that the heat dissipation material 23 completely encapsulates the active surface 25a, the inactive surface 25b, and the side surfaces 25c of the electronic component 25 (as shown in FIG. 2C and FIG. 2D, which are schematic cross-sectional views along cross-section lines B-B and C-C of FIG. 2B), so the electronic component 25 is not exposed from the heat dissipation material 23, therefore the electronic component 25 can effectively dissipate heat via the heat dissipation material 23.

Moreover, for the heat source of the electronic component 25, the heat dissipation structure 2a is closer to the heat source by the design of the heat dissipation block 200 to enhance the heat dissipation effect, and the heat dissipation block 200 is embedded in the heat dissipation material 23 to further enhance the heat dissipation effect.

Furthermore, the first supporting leg 21 is wall-shaped to prevent the liquid heat dissipation material 23 from overflowing.

In addition, the intervals between the first supporting leg 21 and the second supporting leg 22 are used as channels, as shown in FIG. 2B, to accommodate the liquid heat dissipation material 23, and since the heat source is a specific area (i.e., the electronic component 25), the liquid heat dissipation material 23 can be induced to generate convection activities.

FIG. 3A to FIG. 3E are schematic cross-sectional views illustrating a manufacturing method of an electronic package 3 according to a second embodiment of the present disclosure. The difference between this embodiment and the first embodiment lies in the process configuration, and similarities between the two will not be provided to avoid repetitions.

Figure 3A:
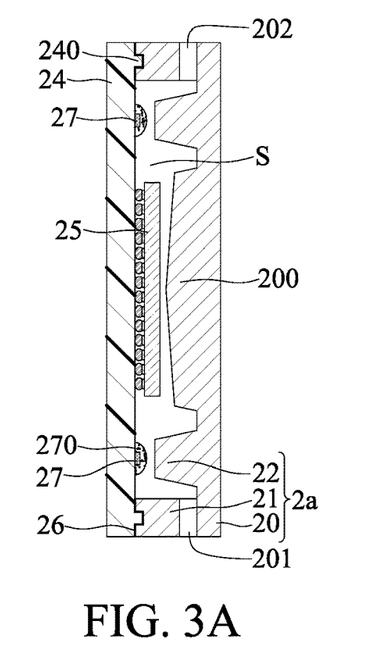
FIG. 3A to FIG. 3E are schematic cross-sectional views illustrating a manufacturing method of an electronic package according to a second embodiment of the present disclosure.

As shown in FIG. 3A, after the heat dissipation structure 2a is fixed on the carrier structure 24, it is rotated at 90 degrees to vertically dispose the heat dissipation structure 2a and the carrier structure 24, such that the first port 201 and the second port 202 of the heat dissipation structure 2a face on top and bottom directions, so the electronic component 25 is in a form of upright package.

Figure 3B:
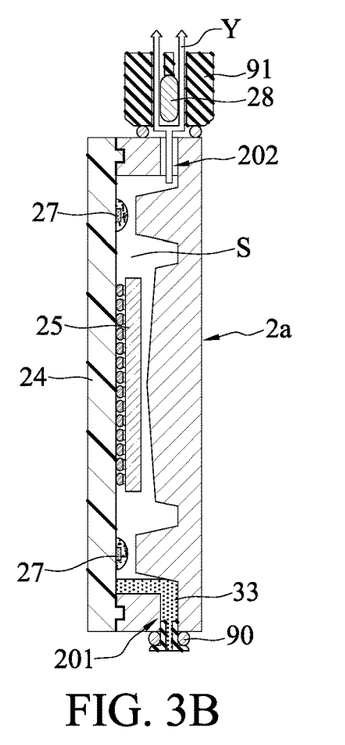

As shown in FIG. 3B, the first port 201 located below the heat dissipation structure 2a is used as a filling port, so that the heat dissipation material 33 is filled into the packaging space S from bottom to top by a filler 90, and the second port 202 located over the heat dissipation structure 2a is used as an exhausting port, so that an air nozzle 91 is disposed on the second port 202 for exhausting operation (e.g., the arrow direction Y).

Figure 3C:
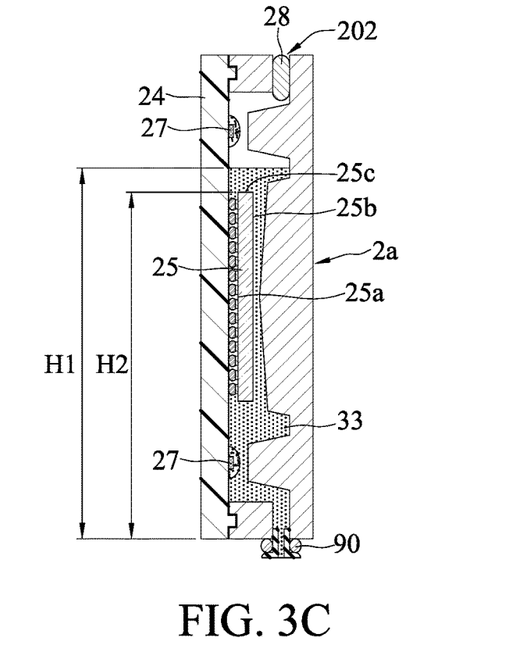

As shown in FIG. 3C, after the electronic component 25 is overflowed (or completely covered) by the heat dissipation material 33, the air nozzle 91 is removed, and then the second port 202 is covered by the plug 28.

In an embodiment, the surface height H2 (i.e., the liquid height position) of the heat dissipation material 33 relative to the first port 201 is higher than the surface height H1 (i.e., the height position of the side surface 25c farthest from the first port 201) of the electronic component 25 relative to the first port 201, such that the heat dissipation material 33 completely encapsulates the active surface 25a, the inactive surface 25b, and the side surfaces 25c of the electronic component 25, so that the electronic component 25 can be effectively dissipated heat by the heat dissipation material 33.

Figure 3D:
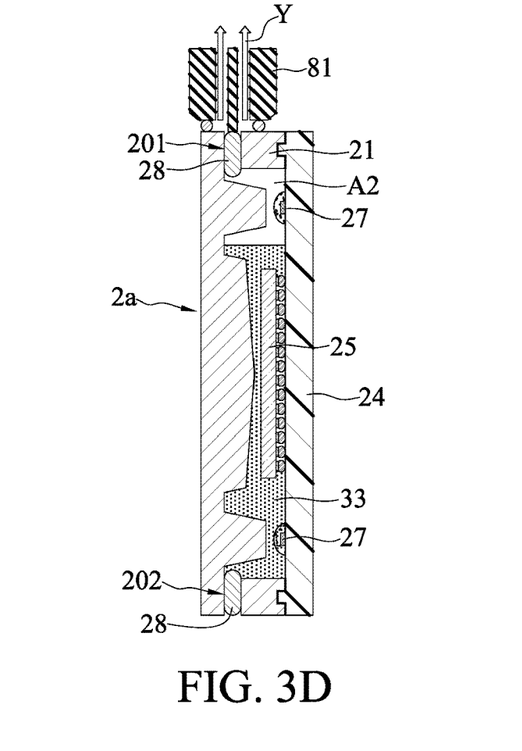

As shown in FIG. 3D, the electronic package 3 is turned upside down, so the first port 201 is located over the heat dissipation structure 2a to be used as an exhausting port to dispose another air nozzle 81 on the first port 201 for exhausting operation (e.g., the arrow direction Y). The first port 201 is covered by another plug 28 after the air inside the packaging space S is discharged, so the target space A2 is formed between the upper first supporting leg 21 and the heat dissipation material 23.

Figure 3E:
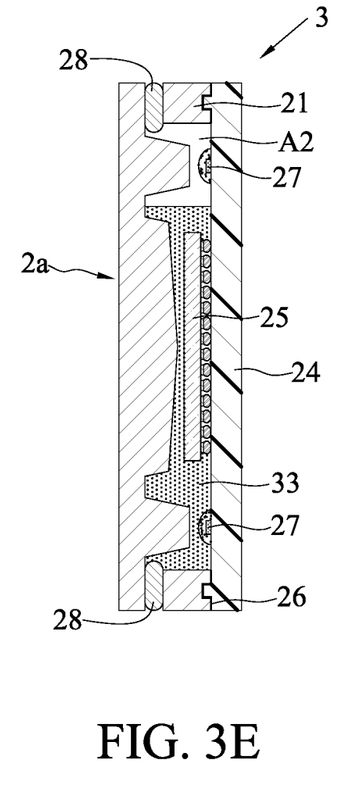

As shown in FIG. 3E, another air nozzle 81 is removed to form the electronic package 3.

Figure 4A:
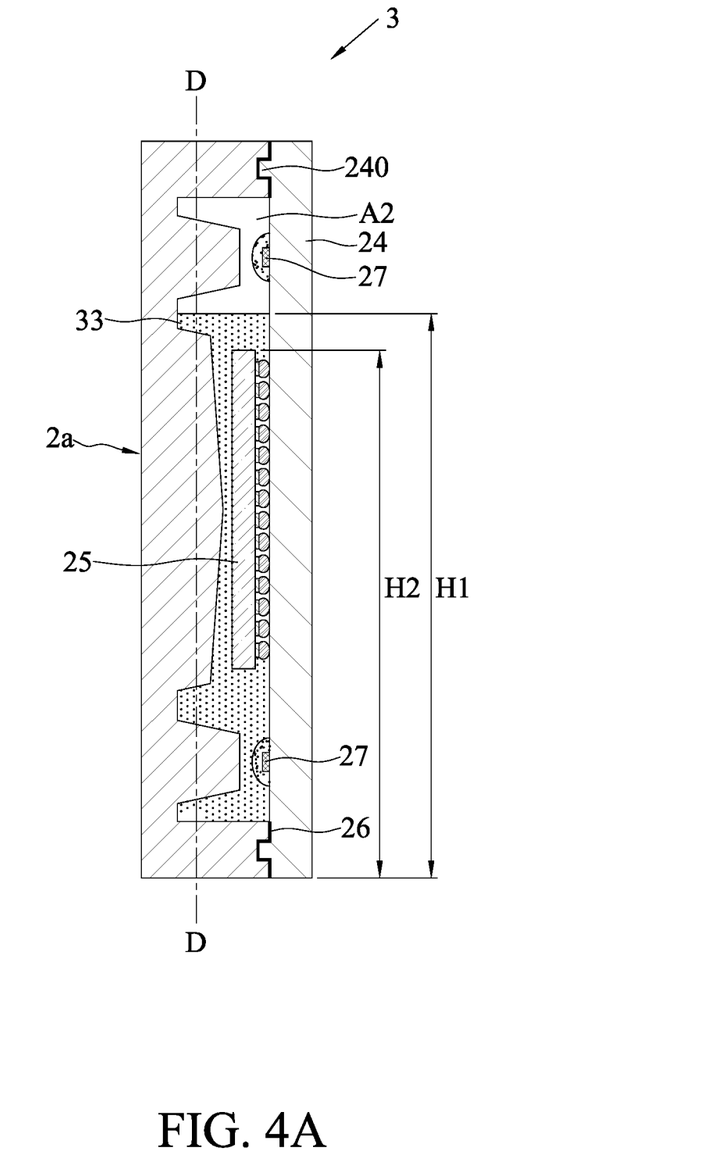
FIG. 4A is a schematic cross-sectional view of an electronic package according to the second embodiment of the present disclosure.
Figure 4B:
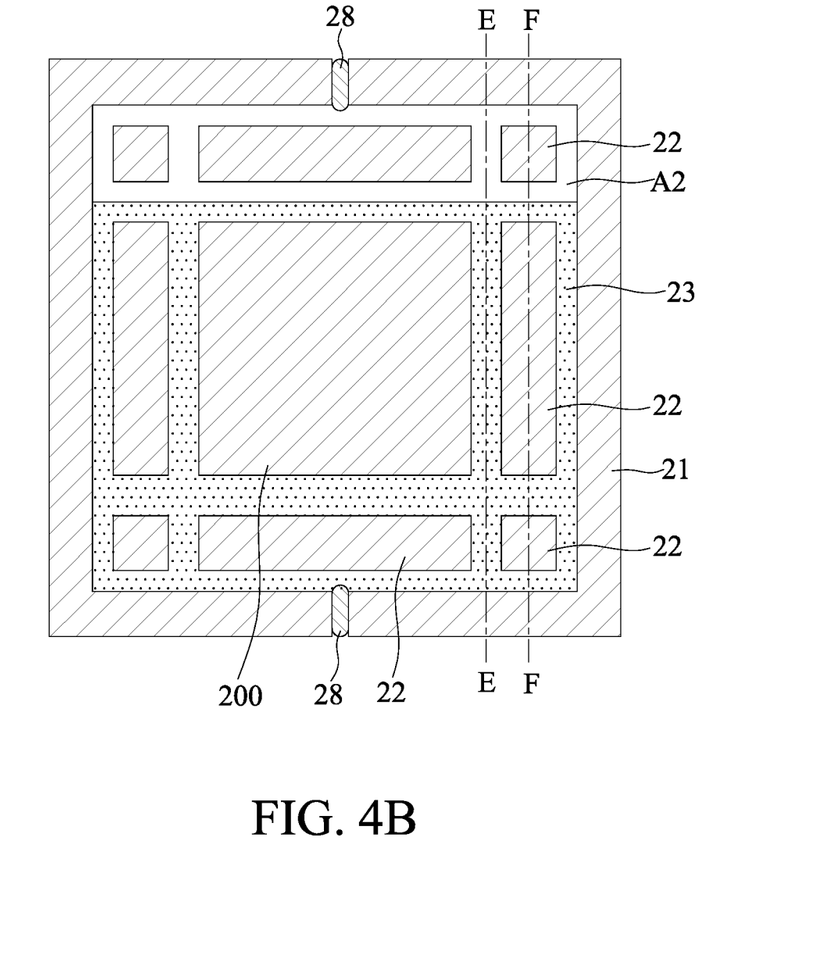
FIG. 4B is a schematic top view along a cross-section D-D of FIG. 4A.
Figure 4C:
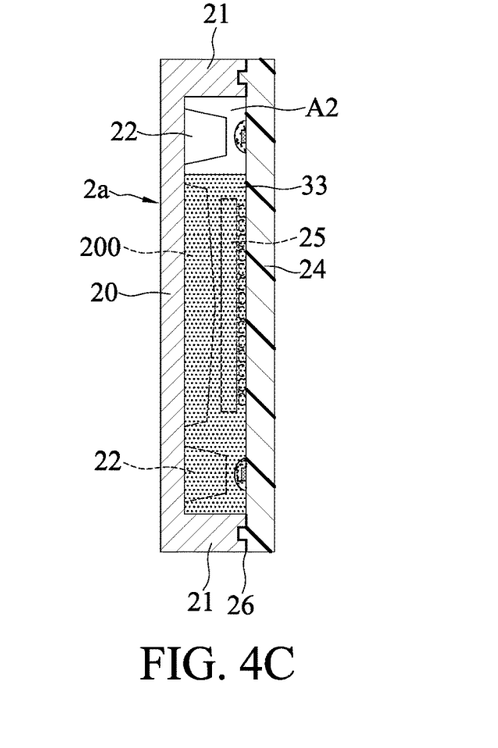
FIG. 4C is a schematic cross-sectional view along a cross-section line E-E of FIG. 4B.
Figure 4D:
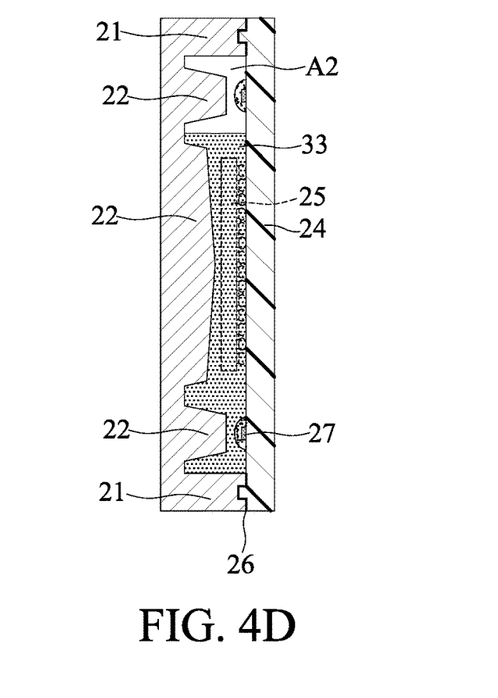
FIG. 4D is a schematic cross-sectional view along a cross-section line F-F of FIG. 4B.

As a result, in the electronic package 3 of the present disclosure, the surface height H1 (i.e., the liquid height position shown in FIG. 4A and FIG. 4B) of the heat dissipation material 33 relative to the second port 202 is higher than the surface height H2 (i.e., the height position of the side surface 25c farthest away from the second port 202 shown in FIG. 4A and FIG. 4B) of the electronic component 25 relative to the second port 202, such that the heat dissipation material 33 completely encapsulates the active surface 25a, the inactive surface 25b, and the side surfaces 25c of the electronic component 25 (as shown in FIG. 4A, FIG. 4C, FIG. 4D), so that the electronic component 25 is not exposed from the heat dissipation material 33, and the electronic component 25 can effectively dissipate heat via the heat dissipation material 33.

Figure 5A:
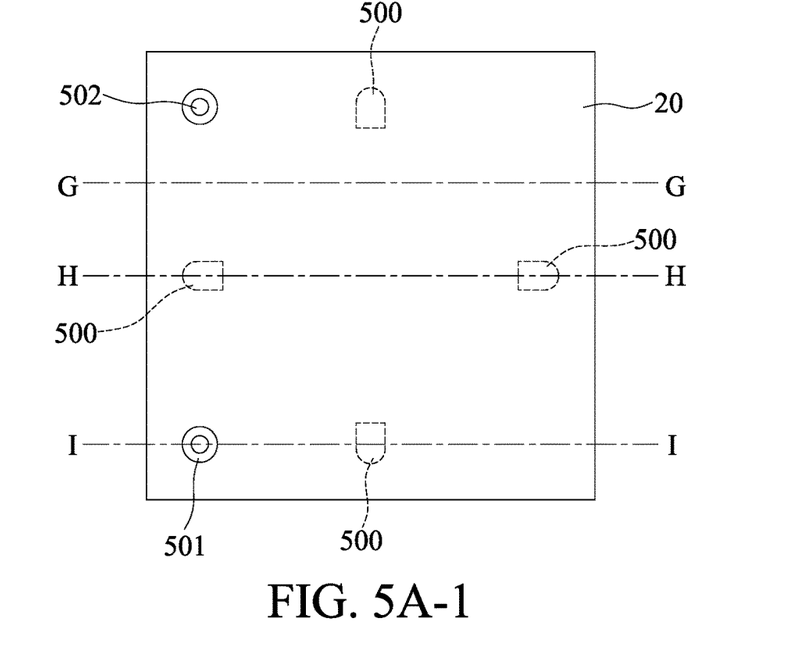
Figure 5A:
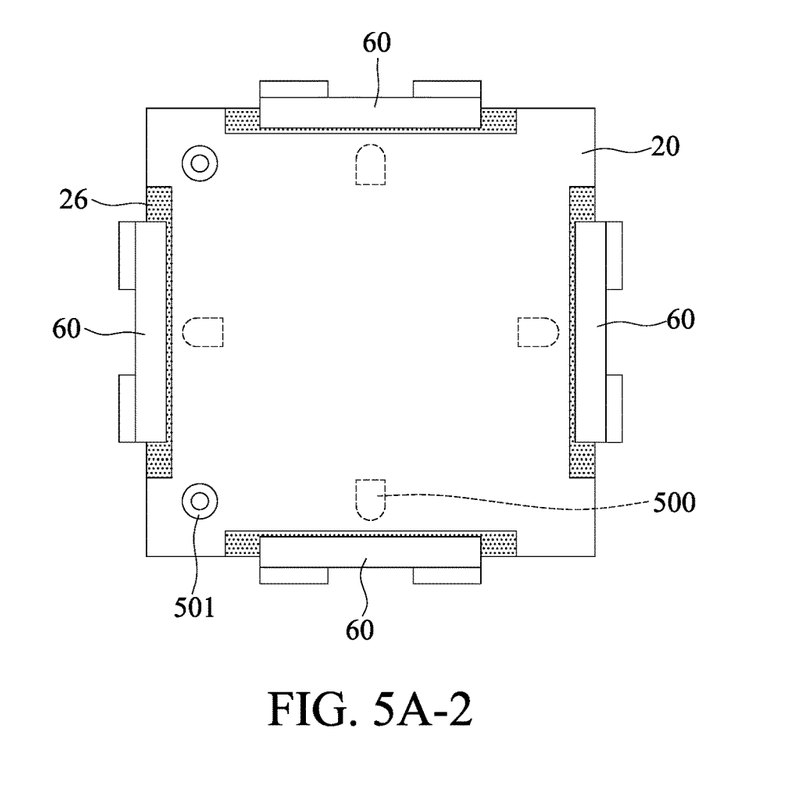
Figure 5B:
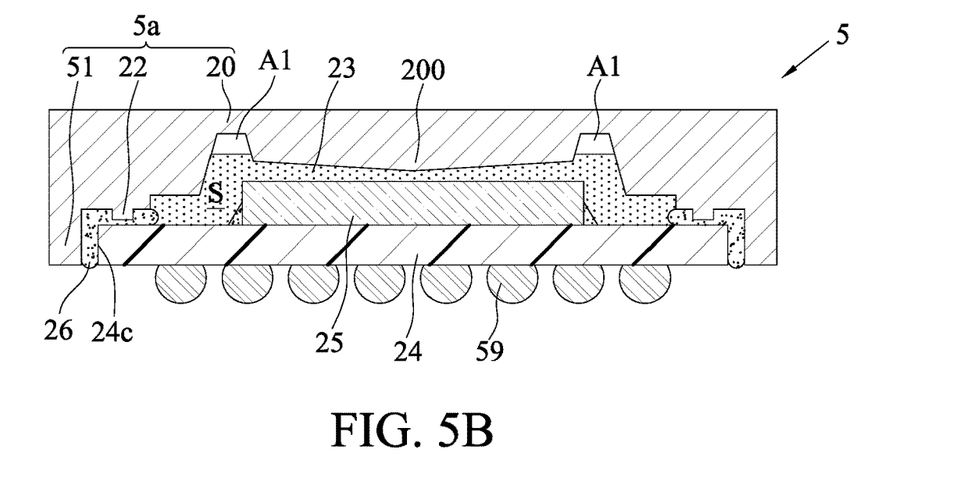
FIG. 5B is a schematic cross-sectional view along a cross-section line G-G of FIG. 5A-1.

FIG. 5A-1 and FIG. 5B are schematic cross-sectional views of an electronic package 5 according to a third embodiment of the present disclosure. The difference between this embodiment and the above embodiments lies in the design of the heat dissipation structure 5a, and similarities between the embodiments will not be provided to avoid repetitions.

Figure 5C:
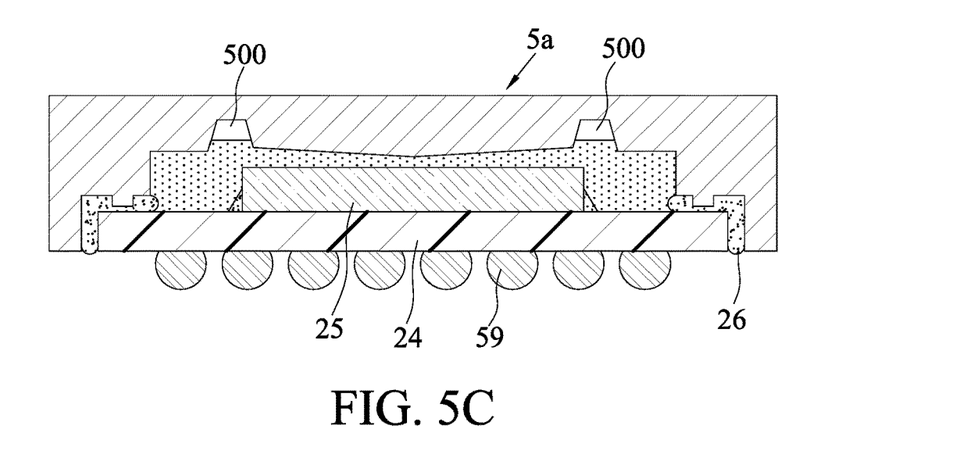
FIG. 5C is a schematic cross-sectional view along a cross-section line H-H of FIG. 5A-1.

As shown in FIG. 5B, in a form of laid package, the first supporting leg 51 of the heat dissipation structure 5a is bonded to the side surface 24c of the carrier structure 24 via the bonding material 26, and a plurality of conductive components 59 containing solder materials can be arranged at the bottom of the carrier structure 24. It should be understood that in a form of upright package (as shown in FIG. 5F-1), the first supporting leg 51 of the heat dissipation structure 5b can also be bonded to the side surface 24c of the carrier structure 24 via the bonding material 26.

Figure 5D:
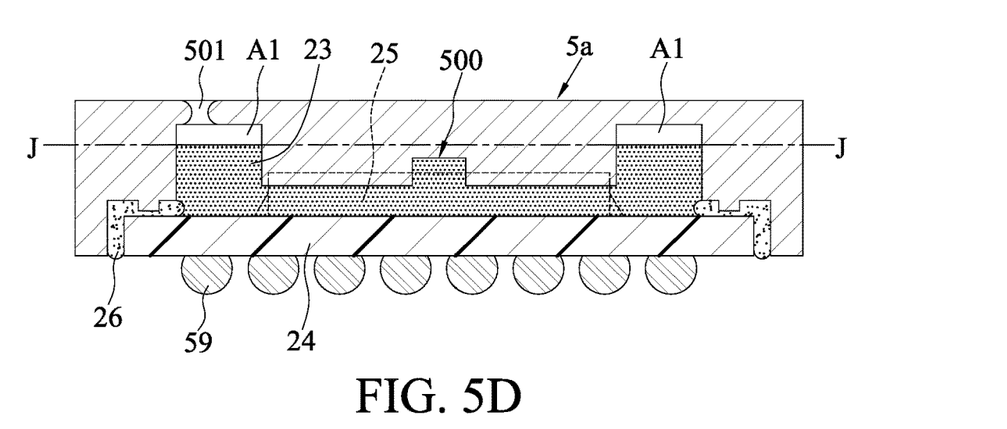
FIG. 5D is a schematic cross-sectional view along a cross-section line I-I of FIG. 5A-1.

In an embodiment, the first port 501 and the second port 502 are formed through the heat dissipation body 20, as shown in FIG. 5A-1 and FIG. 5D.

Figure 5E:
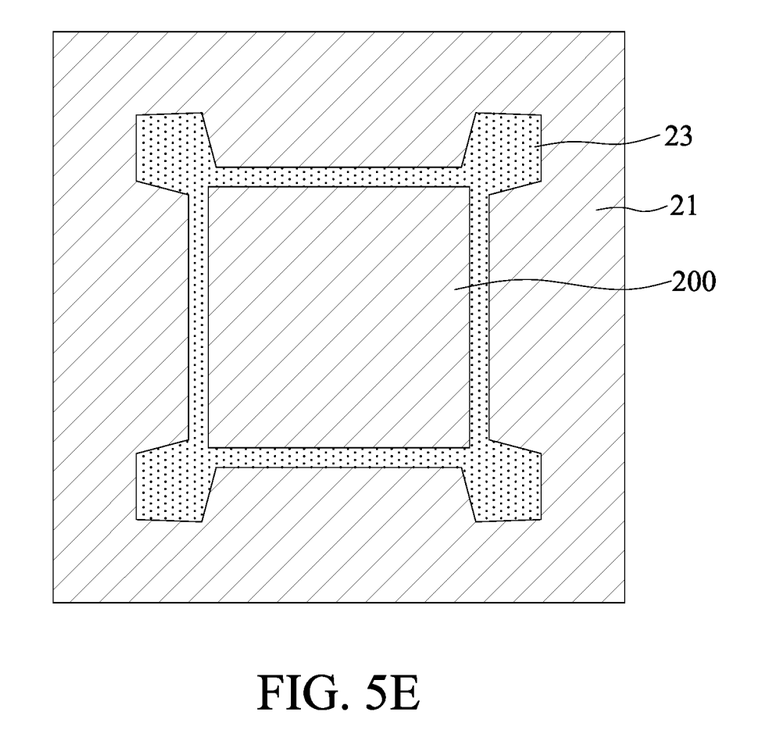
FIG. 5E is a schematic cross-sectional view along a cross-section line J-J of FIG. 5D.
Figure 5F:
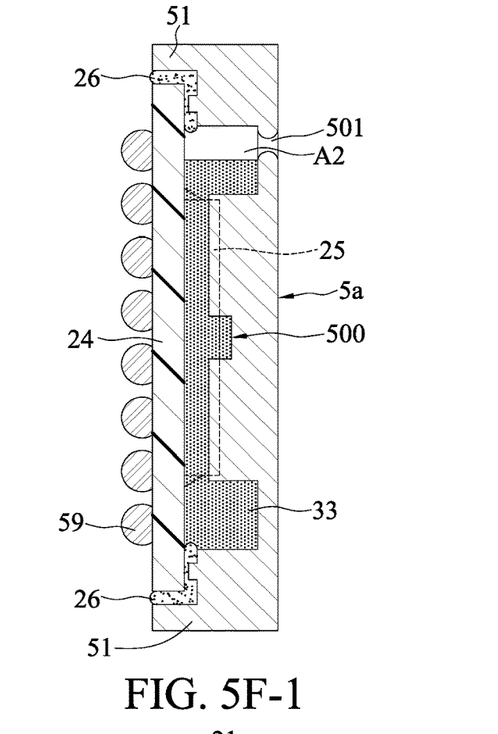

Furthermore, at least one detection recess 500 can be formed on the inner side of the heat dissipation body 20, such as four as shown in FIG. 5A-1, for detecting whether the surface height (i.e., the liquid height position) of the heat dissipation material 23 relative to the carrier structure 24 is higher than the surface height (i.e., the height position of the inactive surface 25b) of the electronic component 25 relative to the carrier structure 24, thereby to effectively ensure that the heat dissipation material 23 completely encapsulates the electronic component 25, as shown in FIG. 5C, FIG. 5D and FIG. 5E.

Hence, when the detection instrument (not shown) detects a predetermined height (e.g., the detection recess 500 is filled up with the heat dissipation material 23 as shown in FIG. 5D), it can be determined that the heat dissipation material 23 has completely encapsulated the electronic component 25.

Moreover, the packaging space S will be presented in negative pressure after the exhausting operation, so the target spaces A1, A2 are formed by the heat dissipation material 23 not filling up the packaging space S, so that the heat dissipation material 23 can be filled into the target spaces A1, A2 when thermally expanded in the subsequent thermal process, thereby avoiding the problem of plate explosion.

Figure 5F:
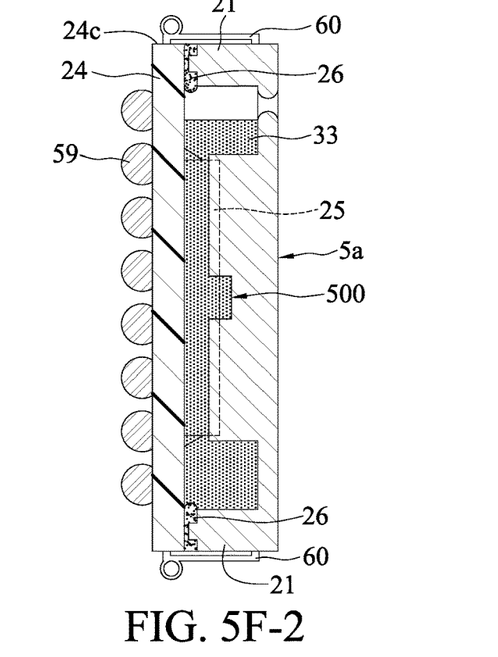

Further, as shown in FIG. 5A-2, in a formed of laid package, after the first supporting leg 21 of the heat dissipation structure 2a is bonded to the carrier structure 24 via the bonding material 26, the first supporting leg 51 and the side surface 24c of the carrier structure 24 can be clamped by clamps 60 for facilitating the subsequent process. For instance, the clamps 60 can be located outside the four edges of the heat dissipation body 20 respectively. It can be understood that in a form of upright package (as shown in FIG. 5F-2), the first supporting leg 21 and the side surface 24c of the carrier structure 24 can also be clamped by the clamps 60.

To sum up, in the electronic package and the manufacturing method thereof of the present disclosure, the electronic component 25 is effectively dissipated heat mainly by the heat dissipation material 23, 33 completely encapsulating the electronic component 25, such that whether the electronic component 25 is in a form of laid package or upright package, both the heat dissipation materials 23, 33 completely encapsulate the electronic component 25.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:
    a carrier structure;
    an electronic component disposed on the carrier structure;
    a heat dissipation structure including a heat dissipation body covering the electronic component and supporting legs vertically disposed on the heat dissipation body, wherein the heat dissipation structure is bonded onto the carrier structure via the supporting legs, such that a packaging space is formed between the heat dissipation body and the carrier structure, and the electronic component is disposed in the packaging space, wherein the supporting legs are formed with accommodation ports coated with a bonding material to engage with protruding portions of the carrier structure; and a heat dissipation material disposed in the packaging space and completely encapsulating the electronic component, wherein the electronic component is free from being exposed from the heat dissipation material.

2. The electronic package of claim 1, wherein the electronic component is in a form of a laid package.

3. The electronic package of claim 1, wherein the electronic component is in a form of an upright package.

4. The electronic package of claim 1, wherein the supporting legs and the carrier structure are spaced apart to form accommodation spaces.

5. The electronic package of claim 4, wherein the accommodation spaces are accommodated with passive components.

6. The electronic package of claim 1, wherein the packaging space is free from being filled up with the heat dissipation material.

7. The electronic package of claim 1, wherein the heat dissipation structure is formed with a first port and a second port that are communicating the packaging space, and the first port and the second port are located at different locations.

8. The electronic package of claim 7, further comprising a plurality of plugs for covering the first port and the second port respectively.

9. The electronic package of claim 1, wherein the supporting legs cover side surfaces of the carrier structure.

10. The electronic package of claim 1, further comprising clamps for clamping the supporting legs and the carrier structure.

11. A method for manufacturing an electronic package, comprising:
providing a heat dissipation structure and a carrier structure with an electronic component, wherein the heat dissipation structure includes a heat dissipation body covering the electronic component and supporting legs vertically disposed on the heat dissipation body;

bonding the supporting legs to the carrier structure to form a packaging space between the heat dissipation body and the carrier structure, wherein the supporting legs are formed with accommodation ports coated with a bonding material to engage with protruding portions of the carrier structure, wherein the electronic component is located in the packaging space; and forming a heat dissipation material in the packaging space to completely encapsulate the electronic component, wherein the electronic component is free from being exposed from the heat dissipation material.

12. The method of claim 11, wherein the electronic component is in a form of a laid package.

13. The method of claim 11, wherein the electronic component is in a form of an upright package.

14. The method of claim 11, wherein the supporting legs and the carrier structure are spaced apart to form accommodation spaces.

15. The method of claim 14, wherein the accommodation spaces are accommodated with passive components.

16. The method of claim 11, wherein the packaging space is free from being filled up with the heat dissipation material.

17. The method of claim 11, wherein the heat dissipation structure is formed with a first port and a second port that are communicating the packaging space, and the first port and the second port are located at different locations, wherein the heat dissipation material is filled into the packaging space via the first port, and the second port is used to exhaust air.

18. The method of claim 17, further comprising covering the first port and the second port respectively via a plurality of plugs after the heat dissipation material completely encapsulating the electronic component.

19. The method of claim 11, wherein the supporting legs cover side surfaces of the carrier structure.

20. The method of claim 11, further comprising clamping the supporting legs and the carrier structure via clamps.

* * * * *